United States Patent
Lam et al.

(10) Patent No.: US 10,262,926 B2
(45) Date of Patent: Apr. 16, 2019

(54) REVERSIBLE SEMICONDUCTOR DIE

(71) Applicant: Nexperia B.V., Nijmegen (NL)

(72) Inventors: Kan Wae Lam, Kwai Chung (HK); Harrie Martinus Maria Horstink, Nijmegen (NL); Sven Walczyk, Nijmegen (NL); Chi Ho Leung, Kwun Tong (HK); Thierry Jans, Nijmegen (NL); Pompeo V. Umali, Kwai Chung (HK); Shun Tik Yeung, Kwai Chung (HK)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 15/286,444

(22) Filed: Oct. 5, 2016

(65) Prior Publication Data

US 2018/0096916 A1  Apr. 5, 2018

(51) Int. Cl.
| | |
|---|---|
| *H01L 23/495* | (2006.01) |
| *H01L 23/29* | (2006.01) |
| *H01L 23/31* | (2006.01) |
| *H01L 23/528* | (2006.01) |
| *H01L 23/00* | (2006.01) |

(52) U.S. Cl.
CPC ...... *H01L 23/49503* (2013.01); *H01L 23/293* (2013.01); *H01L 23/3107* (2013.01); *H01L 23/3114* (2013.01); *H01L 23/4952* (2013.01); *H01L 23/49537* (2013.01); *H01L 23/49541* (2013.01); *H01L 23/528* (2013.01); *H01L 24/05* (2013.01); *H01L 24/06* (2013.01); *H01L 24/49* (2013.01); *H01L 2224/04042* (2013.01); *H01L 2224/06133* (2013.01); *H01L 2224/48247* (2013.01)

(58) Field of Classification Search
CPC ....... H01L 23/528; H01L 24/04; H01L 24/06; H01L 2224/0235; H01L 2224/02373; H01L 2224/02375; H01L 2224/06137; H01L 2224/06157; H01L 2224/06167
See application file for complete search history.

(56) References Cited

U.S. PATENT DOCUMENTS

| | | |
|---|---|---|
| 5,014,112 A | 5/1991 | Gelsomini |
| 5,445,994 A | 8/1995 | Gilton |
| 5,455,460 A | 10/1995 | Honyo et al. |

(Continued)

OTHER PUBLICATIONS

Hess, et al., "Reliability of Bond Over Active Pad Structures for 0.13um CMOS Technology" Electronic Components and Technology Conference, 2003, pp. 1344-1349 IEEE 0-7803-7991-5/03.

*Primary Examiner* — Bryan R Junge
(74) *Attorney, Agent, or Firm* — Ohlandt, Greeley, Ruggiero & Perle, L.L.P.

(57) ABSTRACT

A semiconductor die has internal circuitry formed on two more internal layers, and die bonding pads arranged on a top surface of the die. The bonding pads are connected to the internal circuitry for providing input and output signals to the internal circuitry. One or more connecting lines electrically connect one or more pairs of the die bonding pads, thereby defining a bonding pad layout. The die bonding pads are arranged and connected with the connecting lines such that the bonding pad layout is reversible, which allows the die to be used in different package types (e.g., TSSOP or DFN) yet maintain a standardized pin arrangement without the necessity for long or crossed bond wires.

13 Claims, 6 Drawing Sheets

(56) References Cited

U.S. PATENT DOCUMENTS

| | | | |
|---|---|---|---|
| 6,242,814 B1 | 6/2001 | Bassett | |
| 6,836,010 B2 * | 12/2004 | Saeki | H01L 23/49531 257/685 |
| 6,844,631 B2 | 1/2005 | Yong et al. | |
| 6,921,979 B2 | 7/2005 | Downey et al. | |
| 2003/0075812 A1 * | 4/2003 | Cheng | H01L 23/50 257/784 |
| 2004/0164392 A1 * | 8/2004 | Lee | H01L 24/49 257/686 |
| 2005/0073059 A1 | 4/2005 | Carumba | |
| 2007/0130554 A1 | 6/2007 | Carumba | |
| 2009/0039487 A1 * | 2/2009 | Kawashima | H01L 23/49551 257/676 |
| 2010/0117241 A1 * | 5/2010 | Denda | H01L 24/24 257/773 |
| 2011/0304049 A1 * | 12/2011 | Shigihara | H01L 23/53238 257/762 |

\* cited by examiner

US 10,262,926 B2

REVERSIBLE SEMICONDUCTOR DIE

BACKGROUND

The present invention is directed to semiconductor dies and, more particularly, to a semiconductor die with a specific die pad layout.

Semiconductor dies are cut from a wafer and attached to a lead frame or substrate and then encapsulated with a plastic material to protect the die from being physically damaged. The die typically includes a plurality of electrodes or die bond pads on its "active" surface. These electrodes are connected to corresponding connection points (e.g., lead fingers) on the lead frame or substrate in order to connect the die electrodes to package pins, which are external connection points that facilitate connection of the die internal circuitry to external circuitry.

The packaged die may be provided in various package types, such as a thin shrink small outline package (TSSOP) or Dual Flat No-leads (DFN) to accommodate different user requirements. FIG. 1A shows a 5-pin TSSOP 10 comprising a package body 12 and leads or pins 14 that extend outwardly from the package body 12. FIG. 1B is a cross-sectional view of the TSSOP 10, where a semiconductor die 16 is attached to a flag area of a lead frame and electrically connected to inner portions of leads 14 with bond wires 18. FIG. 2A shows a DFN package 20 having a package body 22 and external connection points 24, which typically are flush with the package body 22. FIG. 2B is a cross-sectional view of the DFN package 20, where the semiconductor die 16 is attached to a flag area of a lead frame and electrically connected to leads with bond wires 26.

Due to various package types and the placement of the die in the package (e.g., on top or bottom of the lead frame), different die layouts are necessary to satisfy requirements for standardized pin assignments. For example, FIG. 3A is a bottom cross-sectional view of the TSSOP 10 that shows the bond wires 18 extending from the die bonding pads to the inner portions of the leads 14. In this case, the wires 18 traverse minimal distances and do not cross with any of the other wires 18. FIG. 3B is a top cross-sectional view of the DFN package 20. However, for this package type, the wires 26 must traverse longer distances, such as across the width of the die 16 like the wires going to pins 2 and 3. Further, some of the wires 26 also cross each other, such as the wires going to pins 1 and 6, and the wires going to pins 3 and 4. Having longer wires and crisscrossing wires can cause assembly risks, yield losses and reduce assembly process speed. However, it also is expensive to provide different versions of the same die, having different pad layouts, to accommodate the different package types.

It therefore would be desirable to have a semiconductor die with its die pads arranged such that the die could accommodate different packaging needs yet maintain the same pin assignments without increasing assembly risks.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Notably, certain dimensions have been exaggerated to facilitate a better understanding of the invention.

In the drawings.

DETAILED DESCRIPTION

In one embodiment, the present invention provides a semiconductor die having internal circuitry formed on two more internal layers, and die bonding pads arranged on a top surface of the die. The bonding pads are connected to the internal circuitry for providing input and output signals to the internal circuitry. One or more connecting lines electrically connect one or more pairs of the die bonding pads, thereby defining a bonding pad layout. The die bonding pads are arranged and connected with the connecting lines such that the bonding pad layout is reversible, which allows the die to be used in different package types (e.g., TSSOP or DFN) yet maintain a standardized pin arrangement without the necessity for long or crossed bond wires.

In another embodiment, the present invention provides a semiconductor device including a substrate, a semiconductor die, bond wires and an encapsulation material. The substrate includes a flag area and a plurality of leads. The semiconductor die is attached to the flag area. The die includes internal circuitry, a plurality of bonding pads disposed on a top surface of the die and electrically connected to the internal circuitry for providing input and output signals thereto, and one or more connecting lines that electrically connect one or more pairs of the die bonding pads. The arrangement of the bonding pads and the connecting lines defines a bonding pad layout. The bond wires electrically connect predetermined ones of the die bonding pads with predetermined ones of the leads. The encapsulation material covers the die and the bond wires, but at least a portion of each of the leads is exposed. The die bonding pads are arranged and connected with the connecting lines such that the bonding pad layout is reversible. That is, the die can be attached to either a top side or a bottom side of a lead frame or substrate and still allow the die bonding pads to be connected to the leads such that a standardized pin arrangement is maintained and long or crossed bond wires are not necessary.

Figure 4A:
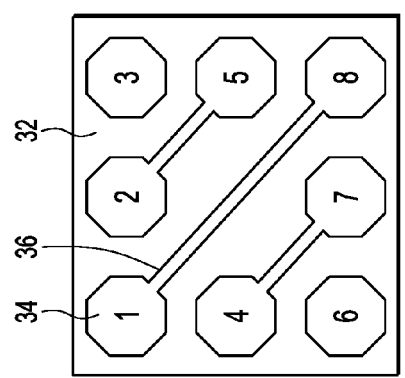
FIG. 4A is top plan view of a semiconductor die having 8 bonding pads in accordance with an embodiment of the present invention.

Referring now to the drawings, wherein the same reference numerals are used to designate the same components throughout the several figures, there is shown in FIG. 4A a top plan view of a semiconductor die 30 in accordance with an embodiment of the present invention. The die 30 has a top or active surface 32 and internal circuitry formed on a plurality of layers beneath the top surface 32. The number of layers and the internal circuitry may be conventional and a detailed description is not required for a full understanding of the present invention.

A plurality of die bonding pads 34 arranged on the top surface 32 of the die 30. In the embodiment shown, there are eight (8) bonding pads arranged along a periphery of the top surface 32, and for convenience are numbered 1-8. The bonding pads 34 are connected to the internal circuitry for providing input and output signals thereto in a conventional way (e.g., with vias). There also are one or more connecting lines 36 that electrically connect one or more pairs of the die bonding pads 34, thereby defining a bonding pad layout. In the embodiment shown, there are three (3) connecting lines 36. Each of the connecting lines 36 electrically connects two (2) of the bonding pads 34 to each other. More particularly, in the presently preferred embodiment, the connecting lines 36 extend diagonally across the die top 32 and connect bond pads 34 on opposing sides of the top surface 32. The connecting lines 36 also are substantially parallel with each other. In a presently preferred embodiment, the connecting lines 36 comprises metal traces that traverse the top surface 32. However, in other embodiments, the connecting lines 36 are formed using vias and lower metal layers of the die 30 for connecting predetermined ones of the die bonding pads 34.

The die bonding pads 34 are arranged and connected with the connecting lines 36 such that the bonding pad layout is reversible. That is, as will be explained in more detail below with reference to FIGS. 4B and 4C, the die 30 can be attached to either a top or bottom of a lead frame and the die pads 34 can still be connected to the same leads of the lead frame using bond wires but without the need for long bond wires or crossing bond wires.

Figure 1A:
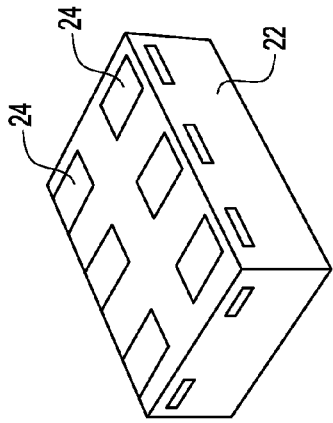
FIG. 1A is an isometric view of a conventional thin shrink small outline package (TSSOP) and FIG. 1B is a side cross-sectional view of the TSSOP.
Figure 1B:
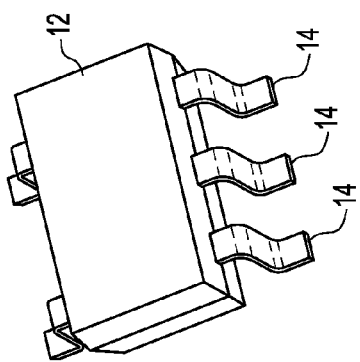
Figure 3B:
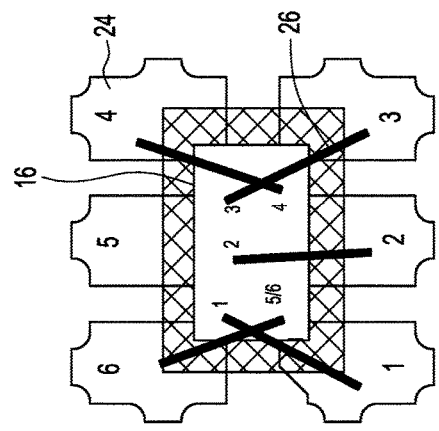
FIG. 3B is a top cross-sectional view of the DFN package of FIG. 2A.
Figure 3A:
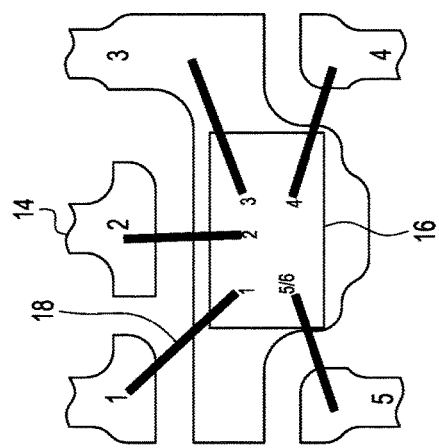
FIG. 3A is a bottom cross-sectional view of the TSSOP of FIG. 1A.
Figure 4C:
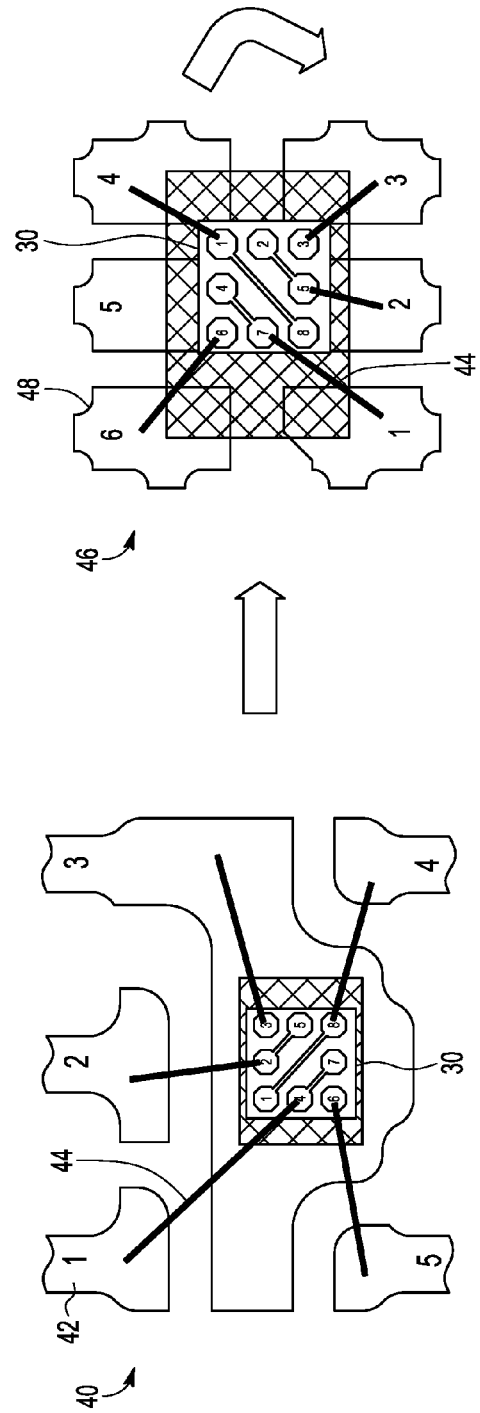
FIG. 4C is a top plan view of the die of FIG. 4A attached to a second lead frame.
Figure 4B:
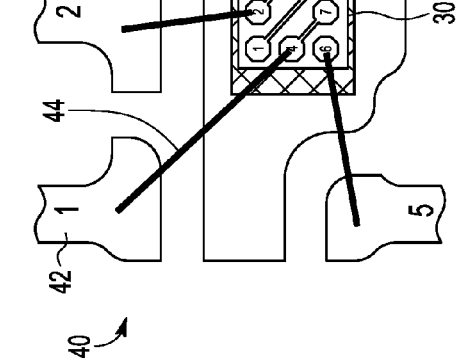
FIG. 4B is a top plan view of the die of FIG. 4A attached to a first lead frame.

FIG. 4B is a top plan view of the die 30 of FIG. 4A attached to a first lead frame 40 for assembly of a TSSOP like the TSSOP 10 shown in FIGS. 1A, 1B and 3A. The lead frame 40 has a plurality of lead fingers 42, which in this embodiment is five (5) lead fingers, which include the labels 1-5. The lead fingers 42-1 to 42-5 are also referred to as pins 1-5. Thus, in the embodiment shown, pin 1 is connected to die bonding pad 34-4 with a bond wire 44; pin 2 is connected to die bonding pad 34-2, pin 3 is connected to die bonding pad 34-3; pin 4 is connected to die bonding pad 34-8, and pin 5 is connected to die bonding pad 34-6. The die bonding pads 34-5 and 34-7 do not have bond wires directly attached thereto. As can be seen, in accordance with good assembly practices, none of the bond wires 44 has to traverse the die top 32, nor do any of the bond wires 44 cross other bond wires.

Figure 2A:
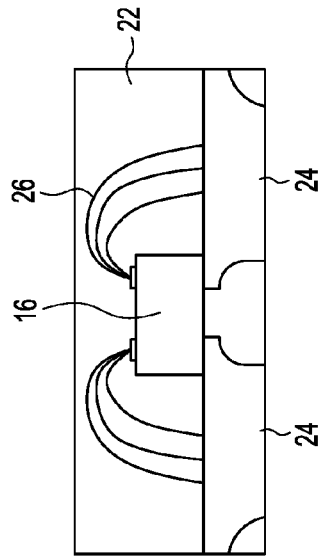
FIG. 2A is an isometric view of a conventional DFN package and FIG. 2B is a side cross-sectional view of the DFN package.
Figure 2B:
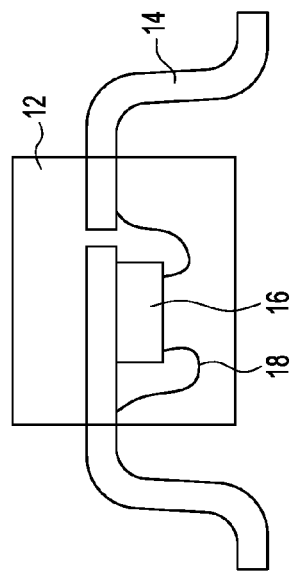

FIG. 4C is a top plan view of the die 30 attached to a second lead frame 46 having six (6) leads or lead fingers 48, which are numbered 1-6. The lead frame 46 is a lead frame for a DFN type package. Thus, like in FIGS. 2A, 2B and 3B, the die 30 is attached to a top surface of the leads 48 (by way of a lead frame flag which is shown in outline).

In this embodiment, pin 1 is connected to die bonding pad 34-7, which is connected to die bonding pad 34-4 by connecting line 36; pin 2 is connected to die bonding pad 34-5, which is connected to die bonding pad 34-2 by one of the connecting lines 36; pin 3 is connected to die bonding pad 34-3; pin 4 is connected to die bonding pad 34-1, and thus also to die bonding pad 34-8 by one of the connecting lines 36; pin 5 is not connected; and pin 6 is connected to die bonding pad 34-6. The die bonding pads 34-2, 34-4 and 34-8 do not have bond wires directly attached thereto. As can be seen, in accordance with good assembly practices, none of the bond wires 44 has to traverse the die top 32, nor do any of the bond wires 44 cross other bond wires. Moreover, the same die 30 is used for both the TSSOP of FIG. 4B and the DFN of FIG. 4C and maintains the same pin assignments simply by rotating the die 90°.

Figure 5A:
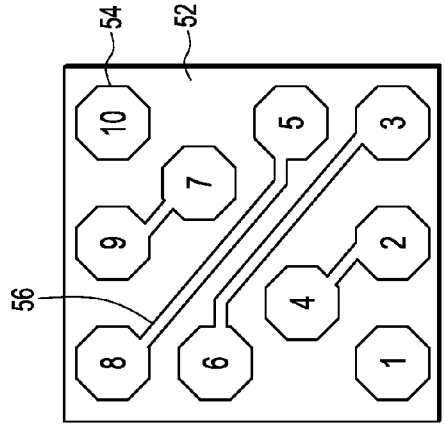
FIG. 5A is top plan view of a semiconductor die having 10 bonding pads in accordance with an embodiment of the present invention.

Referring now to FIG. 5A, a top plan view of a semiconductor die 50 in accordance with another embodiment of the present invention is shown. The die 50 has a top or active surface 52 and internal circuitry formed on a plurality of layers beneath the top surface 52. The number of layers and the internal circuitry may be conventional as discussed with reference to FIG. 4A.

A plurality of die bonding pads 54 arranged on the top surface 52 of the die 50. In the embodiment shown, there are ten (10) bonding pads arranged along a periphery of the top surface 52, and for convenience are numbered 1-10. The bonding pads 54 are connected to the internal circuitry for providing input and output signals thereto in a conventional way (e.g., with vias to underlying metal layers). Generally, the bonding pads 54 are arranged along the periphery of the die top 52. However, when there are greater numbers of bonding pads, such as here, one or more of the bonding pads 54 may be offset from the other, aligned bonding pads. For example, in FIG. 5A, it is apparent that bonding pad 4 is offset from the other bonding pads on the left edge of the die 50 (pads 1, 6 and 8), while on the right side, pad 7 is offset from the die edge and not quite aligned with pads 3, 5 and 10.

There also are one or more connecting lines 56 that electrically connect one or more pairs of the die bonding pads 54, thereby defining a bonding pad layout. In the embodiment shown, there are four (4) connecting lines 56. Each of the connecting lines 56 electrically connects two (2) of the bonding pads 54 to each other. The connecting lines 56 extend diagonally across the die top 52 and connect bonding pads 54 on opposing sides of the top surface 52. The connecting lines 56 also are substantially parallel with each other. In the embodiment shown, die bonding pads 2 and 4, 3 and 6, 5 and 8, and 7 and 9 are connected to each other with respective ones of the connecting lines 56.

The die bonding pads 54 are arranged and connected with the connecting lines 56 such that the bonding pad layout is reversible. That is, as will be explained in more detail below with reference to FIGS. 5B and 5C (and like with die 30 shown in FIGS. 4A-4C), the die 50 can be attached to either a top or bottom of a lead frame and the die bonding pads 54 can still be connected to the same leads of the lead frame using bond wires but without the need for long bond wires or crossing bond wires.

Figure 5C:
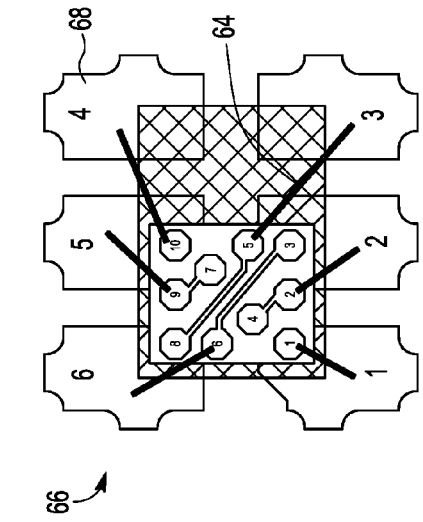
FIG. 5C is a top plan view of the die of FIG. 5A attached to a second lead frame.
Figure 5B:
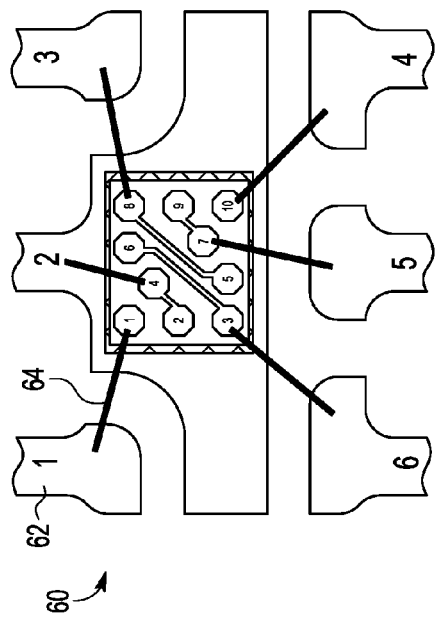
FIG. 5B is a top plan view of the die of FIG. 5A attached to a first lead frame.

FIG. 5B is a top plan view of the die 50 of FIG. 5A attached to a first lead frame 60 for assembly of a TSSOP like the TSSOP 10 (FIGS. 1A, 1B and 3A) and the TSSOP 40 (FIG. 4B). The lead frame 60 has a plurality of lead fingers 62, which in this embodiment is six (6) lead fingers, which include the labels 1-6. The lead fingers 62-1 to 62-6 are also referred to as pins 1-6. Thus, in the embodiment shown, pin 1 is connected to die bonding pad 54-1 with a bond wire 64; pin 2 is connected to die bonding pad 54-4;

pin 3 is connected to die bonding pad 54-8; pin 4 is connected to die bonding pad 54-10; pin 5 is connected to die bonding pad 54-7; and pin 6 is connected to die bonding pad 54-3. The die bonding pads 54-2, 54-5, 54-6 and 54-9 do not have bond wires directly attached thereto. As can be seen, in accordance with good assembly practices, none of the bond wires 64 has to traverse the die top 52, nor do any of the bond wires 64 cross other bond wires.

FIG. 5C is a top plan view of the die 50 attached to a second lead frame 66 having six (6) leads or lead fingers 68, which are numbered 1-6 and referred to as pins 1-6. The second lead frame 66 is a lead frame for a DFN type package. Thus, like in FIGS. 2A, 2B and 3B, and FIG. 4C, the die 50 is attached to a top surface of the leads 68 (by way of a lead frame flag which is shown in outline).

In this embodiment, pin 1 is connected to die bonding pad 54-1, pin 2 is connected to die bonding pad 54-2 with a bond wire 64; pin 3 is connected to die bonding pad 54-5; pin 4 is connected to die bonding pad 54-10; pin 5 is connected to die bonding pad 54-9; and pin 6 is connected to die bonding pad 54-6. The die bonding pads 54-3, 54-4, 54-7 and 54-8 do not have bond wires directly attached thereto. As can be seen, in accordance with good assembly practices, none of the bond wires 64 has to traverse the die top 52, nor do any of the bond wires 64 cross other bond wires. Moreover, the same die 50 is used for both the TSSOP of FIG. 5B and the DFN of FIG. 5C and maintains the same pin assignments simply by rotating the die 90°.

Figure 6A:
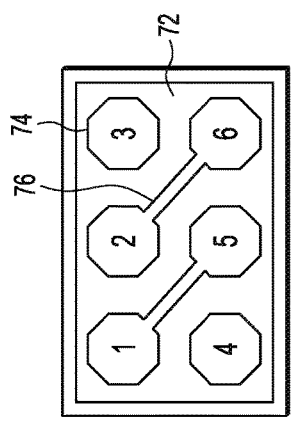
FIG. 6A is top plan view of a semiconductor die having 6 bonding pads in accordance with an embodiment of the present invention.

Referring now to FIG. 6A, a top plan view of a semiconductor die 70 in accordance with yet another embodiment of the present invention is shown. The die 70 has a top or active surface 72 and internal circuitry formed on a plurality of layers beneath the top surface 72. The number of layers and the internal circuitry may be conventional as discussed with reference to FIG. 4A.

A plurality of die bonding pads 74 arranged on the top surface 72 of the die 70. In the embodiment shown, there are six (6) bonding pads arranged along a periphery of the top surface 72, and for convenience are numbered 1-6. The die bonding pads 74 are connected to the internal circuitry for providing input and output signals thereto in a conventional way (e.g., with vias to underlying metal layers). There also are one or more connecting lines 76 that electrically connect one or more pairs of the die bonding pads 74, thereby defining a bonding pad layout. In the embodiment shown, there are two (2) connecting lines 76. Each of the connecting lines 76 electrically connects two (2) of the bonding pads 74 to each other—in this case pads 1 and 5, and 2 and 6 are connected to each other. The connecting lines 76 extend diagonally across the die top 72 and connect bonding pads 74 on opposing sides of the top surface 72. The connecting lines 76 also are substantially parallel with each other.

The die bonding pads 74 are arranged and connected with the connecting lines 76 such that the bonding pad layout is reversible. That is, as will be explained in more detail below with reference to FIGS. 6B and 6C (and like with dies 30 and 50 shown in FIGS. 4A-4C and FIGS. 5A-5C), the die 70 can be attached to either a top or bottom of a lead frame and the die bonding pads 74 can still be connected to the same leads of the lead frame using bond wires but without the need for long bond wires or crossing bond wires in order to maintain standard pin assignments across different package types yet using the same die.

Figure 6C:
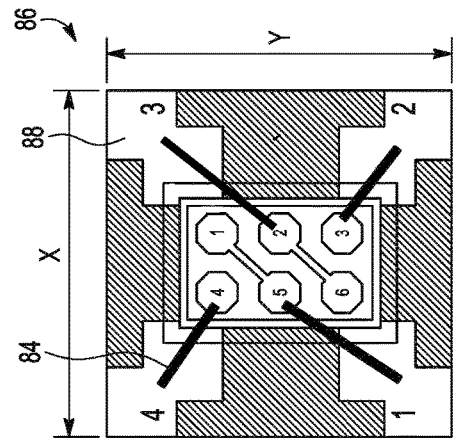
FIG. 6C is a top plan view of the die of FIG. 6A attached to a second lead frame.
Figure 6B:
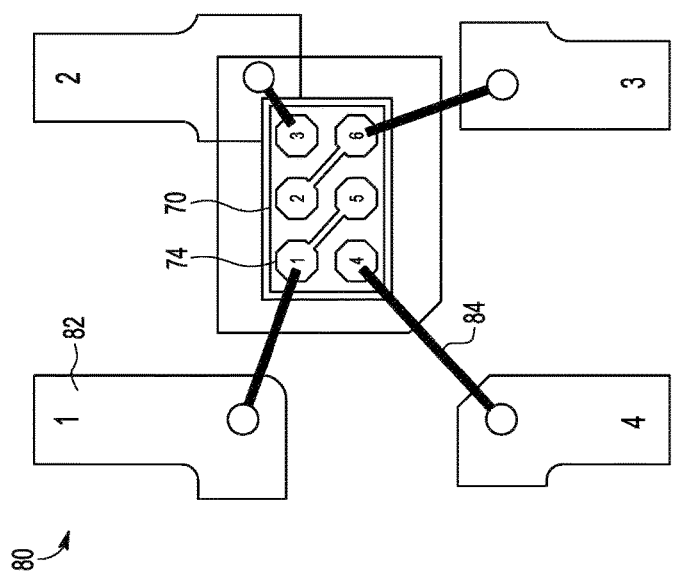
FIG. 6B is a top plan view of the die of FIG. 6A attached to a first lead frame.

FIG. 6B is a top plan view of the die 70 attached to a first lead frame 80 for assembly of a TSSOP like the TSSOP 10 (FIGS. 1A, 1B and 3A), the TSSOP 40 (FIG. 4B), and the TSSOP 60 (FIG. 5B). The lead frame 80 has a plurality of lead fingers 82, which in this embodiment is four (4) lead fingers, which include the labels 1-4. The lead fingers 82-1 to 82-4 are also referred to as pins 1-4. Thus, in the embodiment shown, pin 1 is connected to die bonding pad 74-1 with a bond wire 84; pin 2 is connected to die bonding pad 74-3; pin 3 is connected to die bonding pad 74-6; and pin 4 is connected to die bonding pad 74-4. The die bonding pads 74-2 and 74-5 do not have bond wires directly attached thereto. As can be seen, in accordance with good assembly practices, none of the bond wires 84 has to traverse the die top 72, nor do any of the bond wires 84 cross other bond wires.

FIG. 6C is a top plan view of the die 70 attached to a second lead frame 86 having four (4) leads or lead fingers 88, which are numbered 1-4 and referred to as pins 1-4. The second lead frame 86 is a lead frame for a DFN type package. Thus, like in FIGS. 2A, 2B and 3B, FIG. 4C, and FIG. 5C, the die 70 is attached to a top surface of the leads 88 (by way of a lead frame flag which is shown in outline).

In this embodiment, pin 1 is connected to die bonding pad 74-5; pin 2 is connected to die bonding pad 74-3; pin 3 is connected to die bonding pad 74-3; and pin 4 is connected to die bonding pad 74-4. The die bonding pads 74-1 and 74-6 do not have bond wires directly attached thereto. As can be seen, in accordance with good assembly practices, none of the bond wires 84 has to traverse the die top 72, nor do any of the bond wires 84 cross other bond wires. Moreover, the same die 70 is used for both the TSSOP of FIG. 6B and the DFN of FIG. 6C and maintains the same pin assignments simply by rotating the die 90°.

According to the present invention, a semiconductor die has been described that has a number of connected bond pad pairs (CP), where $CP=(P-2)/2$, where P is the number of bonding pads. The bonding pads generally are aligned along the periphery of an active surface of the die, although in some embodiments, one or more of the bonding pads are offset from the other aligned bonding pads. The die bonding pads also may be formed over active circuitry (Bond Over Active), as is known in the art, or a non-active area of the die.

Figure 7:
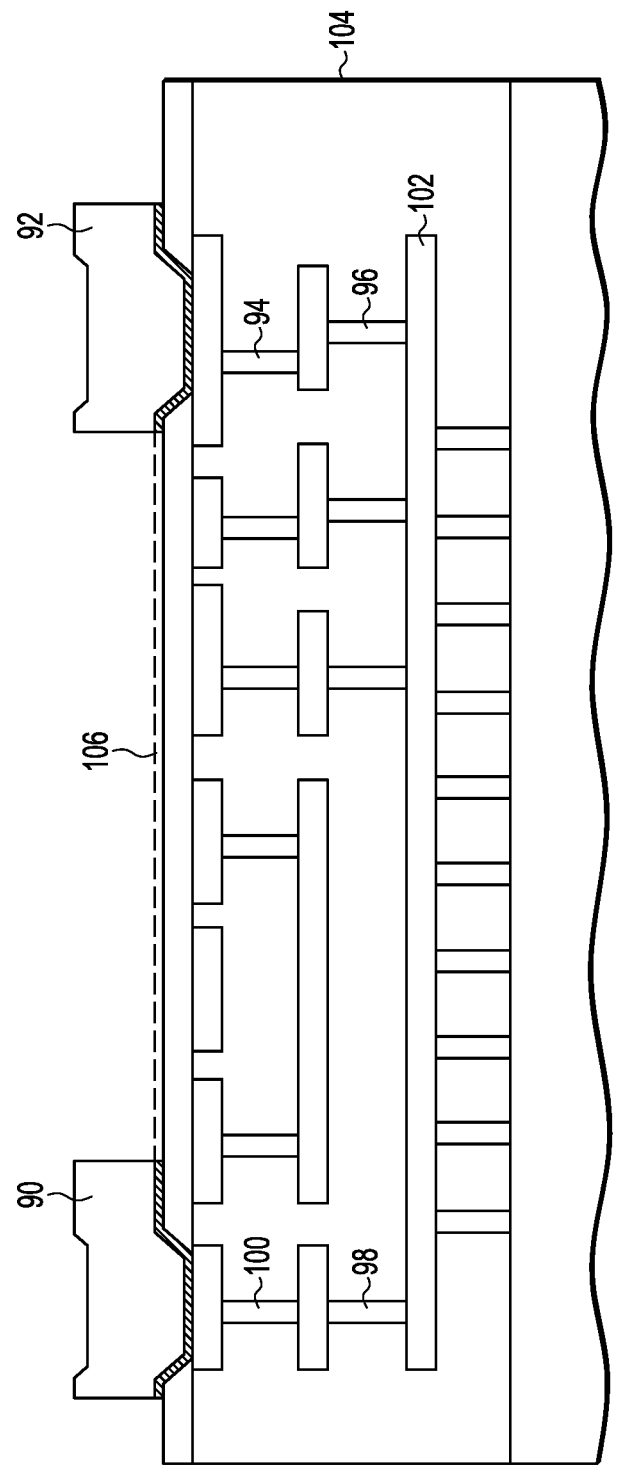
FIG. 7 is a cross-sectional side elevational view of a semiconductor die in accordance with an embodiment of the present invention.

FIG. 7 shows how two bonding pads 90 and 92 may be connected by connecting lines that comprise vias 94-100 and metal trace 102 in a lower layer of a semiconductor die 104. FIG. 7 also illustrates how the bonding pads 90 and 92 could be electrically connected with a connecting line 106, shown in dashed lines, that is formed on a top surface of the die 104.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that boundaries between the above-described operations are merely illustrative. Multiple operations may be combined into a single operation, a single operation may be distributed in additional operations and operations may be executed at least partially overlapping in time. Further, alternative embodiments may include multiple instances of a particular operation, and with the exception of expressly ordered steps, the order of operations may be altered in various other embodiments.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A semiconductor die, comprising:
   an internal circuitry formed on a plurality of layers beneath a top active surface of the semiconductor die;
   a plurality of die bonding pads arranged on the top active surface of the die, wherein the bonding pads are connected to the internal active circuitry beneath the top surface of the semiconductor die and configured to provide input and output signals to the internal active circuitry on the layers under the top active surface; and
   a bonding pad layout comprising a plurality of connecting lines that extend from one side of the die to an opposite side of the die to electrically connect a respective plurality of pairs of the bonding pads,
   wherein the bonding pads are arranged and connected with the connecting lines such that the bonding pad layout is reversible, and
   wherein CP=(P−2)/2, CP being a number of the electrically connected bonding pads pairs and P being a number of the die bonding pads.

2. The semiconductor die of claim 1, wherein the bonding pads are arranged along a perimeter of the die top surface.

3. The semiconductor die of claim 2, wherein two or more of the bonding pads are aligned with one another along a side of the die and another one or more of the bonding pads that are offset from the aligned bonding pads aligned with one another.

4. The semiconductor die of claim 1, wherein the connecting lines comprises metal traces that traverse the top active surface.

5. The semiconductor die of claim 1, wherein the connecting lines extend diagonally from one side of the die to the opposite side of the die.

6. The semiconductor die of claim 5, wherein the connecting lines are substantially parallel with each other.

7. A semiconductor device, comprising:
   a substrate having a flag area and a plurality of leads;
   a semiconductor die attached to the flag area, wherein the semiconductor die comprises an internal active circuitry, a plurality of bonding pads disposed on a top active surface of the die and electrically connected to the internal active circuitry formed on a plurality of layers beneath the top active surface of the die and configured to provide input and output signals to the internal active circuitry on the layers under the top active surface, and a bond pad layout comprising a plurality of connecting lines that extend diagonally from one side of the die to an opposite side of the die to electrically connect a plurality of respective pairs of the die bonding pads;
   a plurality of bond wires electrically connecting predetermined ones of the die bonding pads with predetermined ones of the leads; and
   an encapsulation material that covers the semiconductor die and the bond wires, wherein at least a portion of the leads is exposed,
   wherein the bonding pads are arranged and connected with the connecting lines such that the bonding pad layout is reversible, and
   wherein the connecting lines are substantially parallel with each other.

8. The semiconductor device of claim 7, wherein:

$$CP=(P-2)/2,$$

where CP is the number of electrically connected bonding pad pairs and P is the number of bonding pads.

9. The semiconductor device of claim 8, wherein only one bonding pad of each connected bonding pad pair is connected to a lead with one of the bond wires.

10. The semiconductor device of claim 7, wherein the bonding pads are arranged along a perimeter of the die top active surface.

11. The semiconductor device of claim 10, wherein two or more of the bonding pads are aligned with one another along a side of the die and another one or more of the bonding pads that are offset from the aligned bonding pads.

12. The semiconductor device of claim 7, wherein the connecting lines comprises metal traces that traverse the top surface.

13. The semiconductor device of claim 7, wherein the encapsulation material is an epoxy.

* * * * *